(12) United States Patent  
Bjoerk et al.

(10) Patent No.: US 8,022,447 B2
(45) Date of Patent: Sep. 20, 2011

(54) METAL-OXIDE-SEMICONDUCTOR DEVICE INCLUDING AN ENERGY FILTER

(75) Inventors: Mikael T. Bjoerk, Adliswil (CH); Siegfried F. Karg, Adliswil (CH); Joachim Knoch, Obfelden (CH); Heike E. Riel, Baech (CH); Walter H. Riess, Thalwil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/504,404

(22) Filed: Jul. 16, 2009

(65) Prior Publication Data

US 2009/0273011 A1 Nov. 5, 2009

Related U.S. Application Data

(62) Division of application No. 12/027,608, filed on Feb. 7, 2008.

(51) Int. Cl.
*H01L 29/38* (2006.01)
(52) U.S. Cl. .......... 257/288; 257/329; 257/E21.629
(58) Field of Classification Search .......... 257/344, 257/347, 408–411, 330–332, 135–136, 242, 257/329, 288, 401, 901; 438/259, 270, 271, 438/589, 149, 479, 517
See application file for complete search history.

(56) References Cited

U.S. PATENT DOCUMENTS

| 4,866,488 | A | | 9/1989 | Frensley | |
|---|---|---|---|---|---|
| 5,365,083 | A | | 11/1994 | Tada | |
| 5,818,085 | A | * | 10/1998 | Hsu et al. | 257/347 |
| 6,140,688 | A | * | 10/2000 | Gardner et al. | 257/412 |
| 6,873,009 | B2 | * | 3/2005 | Hisamoto et al. | 257/329 |
| 2007/0187784 | A1 | * | 8/2007 | Wu et al. | 257/412 |
| 2007/0190712 | A1 | * | 8/2007 | Lin et al. | 438/197 |

OTHER PUBLICATIONS

P-F. Wang et al., "Investigation of a Novel Tunneling Transistor by MEDICI Simulation," IEEE, SISPAD, Sep. 2004, pp. 93-96.
D. Pawlik, "Field Induced Band-to-Band Tunneling Effect Transistor (FIBTET)," IEEE, 23rd Annual Microelectronic Engineering Conference, May 2005, pp. 18-21.

* cited by examiner

*Primary Examiner* — Marcos D Pizarro
*Assistant Examiner* — Sue Tang
(74) *Attorney, Agent, or Firm* — Stephen C. Kaufman; Ryan, Mason & Lewis, LLP

(57) ABSTRACT

A MOS device includes first and second source/drains spaced apart relative to one another. A channel is formed in the device between the first and second source/drains. A gate is formed in the device between the first and second source/drains and proximate the channel, the gate being electrically isolated from the first and second source/drains and the channel. The gate is configured to control a conduction of the channel as a function of a potential applied to the gate. The MOS device further includes an energy filter formed between the first source/drain and the channel. The energy filter includes an impurity band operative to control an injection of carriers from the first source/drain into the channel.

6 Claims, 4 Drawing Sheets

METAL-OXIDE-SEMICONDUCTOR DEVICE INCLUDING AN ENERGY FILTER

CROSS REFERENCE TO RELATED APPLICATION

This application is a divisional of pending U.S. application Ser. No. 12/027,608, filed Feb. 7, 2008, the disclosure of which is incorporated by reference herein.

FIELD OF THE INVENTION

The present invention relates to the electrical and electronic arts, and, more particularly, to metal-oxide-semiconductor (MOS) transistor devices.

BACKGROUND OF THE INVENTION

In recent years, improvements of CMOS technology have led to an enormous down-scaling of MOS field-effect transistors (FETs). MOSFET devices with channel lengths less than about 10 nanometers (nm) have been demonstrated. However, besides fabrication-related progress, generally in the form of reduced device geometries, power consumption of highly integrated circuits is becoming more critical, particularly as the demand for high-performance, low-power devices increases. In this respect, the limitation of any conventional FETs to a minimum subthreshold swing, S, of 60 millivolts per decade (mV/dec) at room temperature becomes a major obstacle to further reduce the operational voltage while leaving an on/off-ratio of the devices constant.

In a MOSFET device, the minimum voltage swing needed to switch the device from an "on" state to an "off" state is an important figure of merit for determining low power performance of the device. This characteristic is usually quantified by measuring how many millivolts (mV) it takes to change the drain current in the device by one order of magnitude, i.e. one decade of current on a logarithmic scale. The measure of this characteristic is called the inverse subthreshold slope and is given in units of mV/decade of current change. In a MOSFET device, the subthreshold swing is limited by thermal voltage, $kT/q$, where $k$ is Boltzmann's constant ($1.38 \times 10^{-23}$ J/°K), T is temperature in degrees Kelvin (°K), and q is the charge of an electron ($1.60 \times 10^{-19}$ C). This thermal voltage is about 26 mV at room temperature (e.g., about 300°K), and hence $S = kT/q \ln(10) \approx 60$ mV/dec.

Provided a certain ratio between the off-state and the on-state current of approximately three orders of magnitude is required and if we assume that two thirds of the maximum applied gate voltage is needed to obtain a high on-state current, one needs at least a gate voltage range of about $3 \times (3 \cdot 60) = 540$ mV to properly operate the device. In turn this means that scaling down the supply voltage of devices limited to a subthreshold swing of 60 mV/dec leaves only two options: either the off-state leakage is increased or the on-state performance is deteriorated. Accordingly, transistor devices that show an inverse subthreshold slope significantly steeper than 60 mV/dec and still provide a high on-state performance are particularly desirable.

SUMMARY OF THE INVENTION

An illustrative embodiment of the present invention meets the above-noted need by providing techniques for forming a MOS transistor device capable of achieving an inverse subthreshold slope that is smaller than about 60 mV/dec. To accomplish this, an energy filter including an impurity band therein is inserted in the device between a source and a channel in the device. The energy filter can be "tuned" in terms of certain characteristics, including energetic width and position, in order to achieve a desired trade-off between high on-state current and low off-state leakage (and steep inverse subthreshold slope) in the device. This can be achieved, in accordance with aspects of the invention, by selecting an appropriate dopant species and concentration level thereof.

In accordance with one aspect of the invention, a MOS device includes first and second source/drains spaced apart relative to one another. A channel is formed in the device between the first and second source/drains. A gate is formed in the device between the first and second source/drains and proximate the channel, the gate being electrically isolated from the first and second source/drains and the channel. The gate is configured to control a conduction of the channel as a function of a potential applied to the gate. The MOS device further includes an energy filter formed between the first source/drain and the channel. The energy filter includes an impurity band operative to control an injection of carriers from the first source/drain into the channel.

In accordance with another aspect of the invention, a method of forming a metal-oxide semiconductor (MOS) device includes the steps of: forming a device layer on an upper surface of at least a portion of a buried oxide layer; forming a gate oxide layer on at least a portion of an upper surface of the device layer; forming a gate on at least a portion of an upper surface of the gate oxide layer, the gate being formed substantially proximate a channel defined in the device layer; doping at least a portion of the device layer not covered by the gate and the gate oxide layer with at least one impurity of a prescribed concentration level so as to form a drain therein; forming an insulator spacer on at least one sidewall of each of the gate, the gate oxide layer and the device layer; doping at least a portion of the insulator spacer with at least one impurity of a prescribed concentration level so as to form an energy filter therein; and forming a metallic source contact on at least a portion of an upper surface of the insulator spacer.

In accordance with yet another aspect of the invention, a method of forming a metal-oxide semiconductor (MOS) device includes the steps of: forming first and second source/drains, the first and second source/drains being spaced apart relative to one another; forming a channel between the first and second source/drains; forming a gate between the first and second source/drains and proximate the channel, the gate being electrically isolated from the first and second source/drains and the channel and being configured to control a conduction of the channel as a function of a voltage potential applied to the gate; and forming an energy filter between the first source/drain and the channel, the energy filter comprising an impurity band operative to control an injection of carriers from the first source/drain into the channel.

These and other features, aspects, and advantages of the present invention will become apparent from the following detailed description of illustrative embodiments thereof, which is to be read in connection with the accompanying drawings.

DETAILED DESCRIPTION OF THE INVENTION

One or more embodiments of the present invention provide a means for forming a transistor device capable of achieving an inverse subthreshold slope smaller than about 60 mV/dec. While certain aspects of the invention are described herein in the context of implementations of a transistor device using a complementary metal-oxide-semiconductor (CMOS) fabrication process, it should be understood that the present invention is not limited to the specific implementations shown, nor is the invention limited to a CMOS fabrication process.

Figure 1:
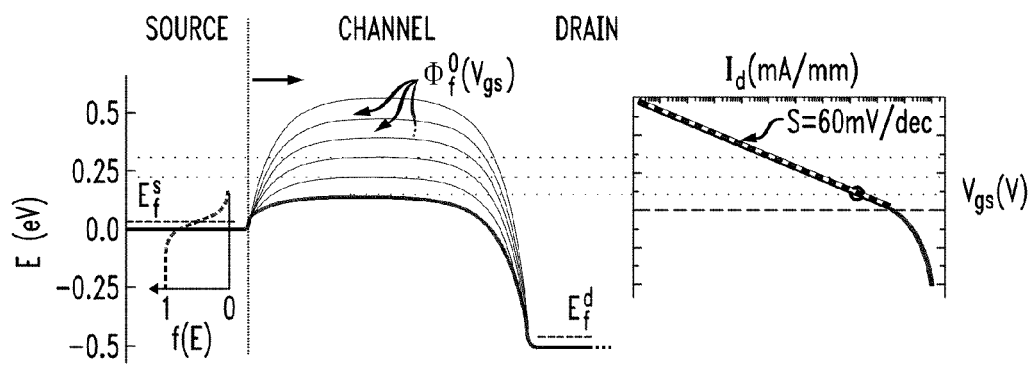
FIG. 1 illustrates a conduction band diagram corresponding to a conventional MOSFET device along the direction of carrier transport for several gate voltages.

One reason for the limitation of subthreshold swing to 60 mV/dec is that the switching mechanism of conventional MOSFET devices relies primarily on the modulation of carrier injection from a thermally broadened Fermi function. FIG. 1 illustrates a conduction band in a conventional MOSFET device along a direction of carrier transport in a channel for several different gate voltages. As apparent from the figure, a change in gate voltage will lead to an equivalent change in the potential maximum (i.e., the maximum barrier within the channel), $\Phi_f^0$, that determines the injection of carriers in the channel. As a result, the drain current increases exponentially with a minimum inverse subthreshold slope S of about 60 mV/dec. The right panel in FIG. 1 provides an exemplary graph depicting drain current versus gate voltage on a logarithmic scale; here, $E_f^s$ and $E_f^d$ are the source and drain Fermi energy levels, respectively. The inverse subthreshold slope is indicated by the dashed line appearing in the figure. For increasing gate voltage, an increasingly greater fraction of carriers residing in the exponential tail of the source Fermi function can contribute to the current and hence give rise to an exponential increase of current with an inverse subthreshold slope of:

$$S = \ln(10) \cdot (\partial I_d/\partial V_{gs} \cdot 1/I_d)^{-1} = k_B T/q \ln(10) = 60 \text{ mV/dec},$$

where $\partial I_d/\partial V_{gs}$ is the partial derivative of drain current ($I_d$) as a function of gate-to-source voltage ($V_{gs}$) of the device.

Since the switching mechanism of conventional MOSFET devices is dependent on modulation of the injection of carriers from a thermally broadened Fermi function, then in order to achieve inverse subthreshold slopes below 60 mV/dec, as stated above, current injection from a source of the device is preferably modified in such a way that it becomes independent of the thermally broadened Fermi distribution function. This can be accomplished, in accordance with aspects of the invention, by inserting an energy filter between the source and a channel of the device which substantially cuts off high- and low-energy tails of the source Fermi distribution, thereby leading to an effective "cooling" of the Fermi function. The overall concept is illustrated with reference to FIG. 2 and described in further detail below.

It is to be appreciated that, in the case of a simple MOSFET device, because the MOSFET device is symmetrical by nature, and thus bidirectional, the assignment of source and drain designations in the device is essentially arbitrary. Hence, the energy filter may, in other embodiments of the invention, be formed between the drain and the channel of the device. More generically, the source and drain may be referred to as first and second source/drain, respectively, where "source/drain" in this context denotes a source or a drain.

Recently, it was shown that a FET device utilizing band-to-band tunneling (BTBT) provides an effective means of reducing short channel effects in the device, thereby allowing scaling (e.g., reduction of device geometries) to a larger extent than otherwise possible in standard MOSFET devices (see, e.g., U.S. Pat. No. 5,365,083 to Tada, the disclosure of which is incorporated by reference herein). However, BTBT FETs exhibit the following drawbacks:

Since BTBT FETs comprise a tunneling barrier, BTBT FETs always exhibit on-state currents which are significantly lower when compared to conventional MOSFET devices.

On-state currents of BTBT FETs can be made larger but require extremely scaled gate oxide thicknesses and very thin diameters of nanowires used as active channel material. Such thin gate oxides lead to large off-state leakage currents due to direct tunneling through the gate dielectric, thereby diminishing certain advantages of BTBT FETs.

To ensure a high probability that BTBT will occur in the device, extremely abrupt doping profiles and very high doping levels are required in the BTBT FETs, which are difficult, and thus costly, to manufacture.

In order for the BTBT FETs to function, a doped source contact is necessary which leads to excessive variability as the devices are scaled, for example, to a nanometer range. Furthermore, thinning, for instance, semiconductor (e.g., silicon) nanowires in the device leads to a deactivation of dopants. Moreover, a doped contact section leads to parasitic resistances.

A gate of the BTBT FET device must be aligned as accurately as possible with respect to a source side p-n junction of the device in order to provide optimum gate control over the channel without significantly affecting the source contact.

In order to increase the probability that BTBT will occur in the BTBT FET device, the energy gap in the device should not be too large. A small band gap, however, typically leads to a significant increase in off-state leakage currents. Furthermore, the BTBT FET device exhibits ambipolar conduction, and hence the maximum allowed drain-to-source voltage ($V_{ds}$) in the device will be limited.

Figure 2:
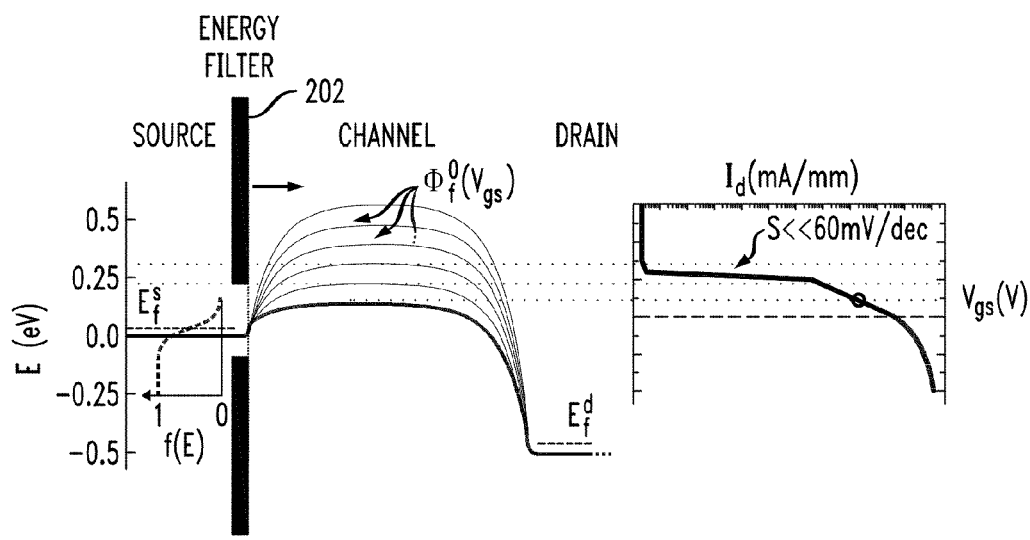
FIG. 2 illustrates a conduction band diagram corresponding to an exemplary MOSFET device along the direction of carrier transport for several gate voltages, in accordance with an embodiment of the invention.

FIG. 2 is a conduction band diagram corresponding to an exemplary MOSFET device along the direction of carrier transport in a channel of the device for several different gate voltages, in accordance with an aspect of the invention. An energy filter 202 is formed between a source and a channel in the device. The energy filter 202 includes an energetic window, visualized as an opening in the energy filter. Ideally, carriers may only be injected into the channel through the energetic window.

The energy filter 202 preferably comprises an insulator having an appropriate band gap and an impurity band, also referred to as a defect band, within the band gap. The impurity band can be formed by doping the insulator with an impurity of a prescribed type and concentration level. The impurity band in the energy filter 202 is preferably controlled, at least in terms of an energetic position of the impurity band relative to the channel in the device, so as to substantially cut off a high- and/or low-energy tail portion of a source Fermi distribution function. This is illustrated in the right panel of FIG. 2, which depicts drain current versus gate voltage on a logarithmic scale. As apparent from the figure, increasing the gate voltage leads to a very steep increase in drain current, with approximately the same on-state current as for the conventional MOSFET device shown in FIG. 1. Additionally, an energetic width of the impurity band is preferably controlled so as to optimize a trade-off between high on-state current in the device and energy filter efficiency. The energetic position and width of the impurity band in the energy filter 202 is a function of dopant species and concentration level.

Figure 3:
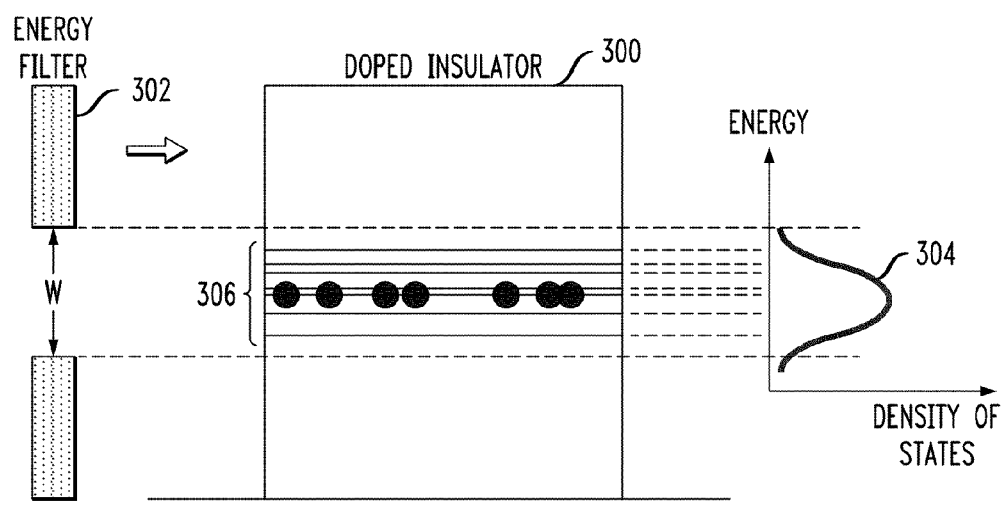
FIG. 3 is a conceptual diagram illustrating realization of an exemplary energy filter, in accordance with an embodiment of the invention.

With reference now to FIG. 3, an implementation of an exemplary energy filter 300 is shown, in accordance with an embodiment of the invention. The energy filter 300 is shown alongside its visual representation 302 and its graphical filter "transfer function" 304. As stated above, energy filter 300 may be realized as an insulator which is doped with an impurity to form an impurity band 306 therein which serves as an energetic window through the filter. The insulator may comprise an alloy of two or more different insulating materials. In other embodiments of the invention, the energy filter 300 may comprise a plurality of insulating layers. The insulating layers may be of the same or of different materials. Additionally, each of the insulating layers may be doped with the same or different impurities relative to one another to form the impurity band therein.

Materials suitable for forming the insulator include, but are not limited to, zinc oxide (ZnO), zinc sulfide (ZnS), zinc selenide (ZnSe), strontium titanate ($SrTiO_3$), and diamond. Suitable dopants and preferred doping level ranges corresponding thereto include aluminum or nitrogen, with a doping range of about 0.02 to 2.0 percent, lanthanum or niobium, with a doping range of greater than or equal to about 0.01 percent, and boron, with a doping range of greater than about 0.1 percent. These dopants and doping ranges are merely illustrative and are in no way intended to limit the invention. Other suitable dopants and doping ranges may be similarly employed.

An energetic width, W, of the window in energy filter 300 corresponds to a width of the impurity band and is indicative of a portion of the filter through which injected carriers may pass. A preferred width of the impurity band can be about 1 to 10 millielectron volts (meV) in crystals or epitaxial layers. In disordered films, the width of the impurity band may increase to several tens of meV. It is to be appreciated, however, that the invention is not limited to any specific width of the impurity band. With regard to filter transfer function 304, a peak density of states preferably defines a middle of the impurity band 306, with the density of states falling off according to a Gaussian, or alternative distribution. The narrower in energy this curve gets, the steeper the corresponding subthreshold slope will be in the device.

Embodiments of the invention are capable of achieving inverse subthreshold slopes steeper than 60 mV/dec. In order to demonstrate this, full quantum simulations of exemplary transistor devices can be performed, in accordance with an aspect of the invention. The simulations may include self-consistently solving a Poisson equation together with employing a non-equilibrium Green's function formalism on a finite difference grid. In the channel area, an effective mass approximation is preferable employed; ballistic transport is assumed for simplicity. As is known by those skilled in the art, Green's function is a type of mathematical function used to solve inhomogeneous differential equations subject to prescribed boundary conditions. In quantum field theory and statistical field theory, the term is used to refer to various types of correlation functions, even those that do not fit the mathematical definition.

Figure 4:
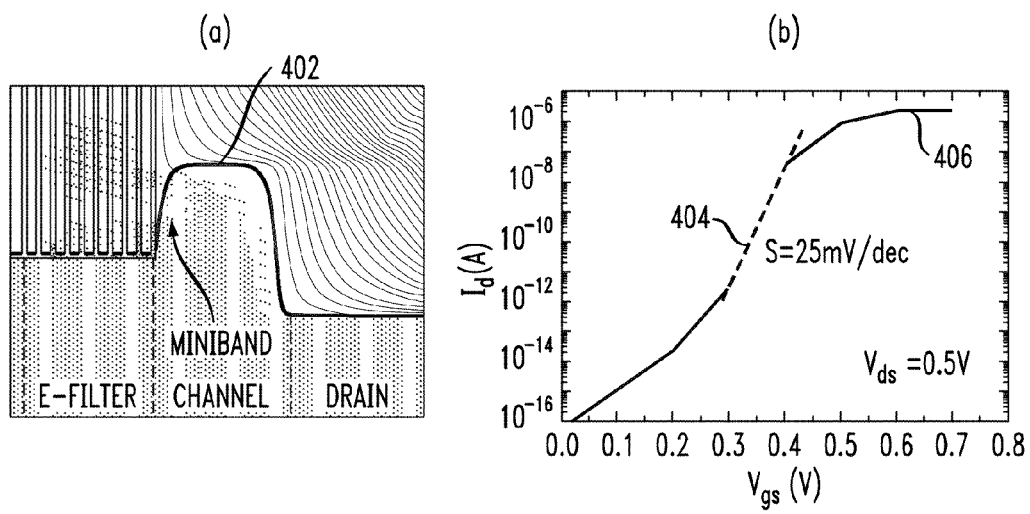
FIGS. 4A and 4B are exemplary simulations corresponding to a MOS device including an energy filter, in accordance with an embodiment of the invention.

FIGS. 4A and 4B are exemplary simulations corresponding to a transistor device including an energy filter, in accordance with an embodiment of the invention. The energy filter can be modeled by simply inserting a certain number of finite difference points between the source and the channel, where a hopping element can be adjusted in order to simulate an impurity band of finite energetic width. FIG. 4A shows a gray-scale plot of local density of states associated with an exemplary transistor device including an energy filter, in accordance with an aspect of the invention. Trace 402 is indicative of a surface potential profile along the direction of current transport. The energy filter inserted between the channel and the actual source contact is clearly visible as a miniband structure since the dopants are assumed to be perfectly ordered to ease calculations. An impurity band, inserted at the source side of the device between the beginning of the channel and the source contact, builds up acting as the desired energy filter. The impurity band (miniband) is clearly visible. Carriers will only be injected through this energetic window.

FIG. 4B is a graph depicting an exemplary transfer characteristic of the device corresponding to the plot shown in FIG. 4A. When the gate voltage moves the conduction band down, a rapid increase in drain current in the device is expected (at 404) indicative of the potential maximum in the channel being substantially aligned with an upper energetic edge of the impurity band. As apparent from the figure, an inverse subthreshold slope of about 25 mV/dec over four orders of magnitude is observed in the device's off-state. In addition, the device exhibits rather large on-state current (at 406) on the order of about 500 milliamperes per millimeter (mA/mm). Optimizing the impurity band in terms of energetic width and/or position, a band that substantially and efficiently cuts off high- and low-energy tails of the Fermi function will yield the best trade-off for realizing a device with steep slope and highest possible on-state current.

Particularly with respect to processing steps, it is emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of standard process steps used to fabricate such semiconductor devices may be found in a number of publications, for example, S. Wolf and R. N. Tauber, *Silicon Processing for the VLSI Era, Volume 1*, Lattice Press, 1986 and S. M. Sze, *VLSI Technology, Second Edition*, McGraw-Hill, 1988, both of which are incorporated herein by reference.

It should also be understood that the various layers and/or regions shown in the accompanying figures are not drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit device.

Figure 5:
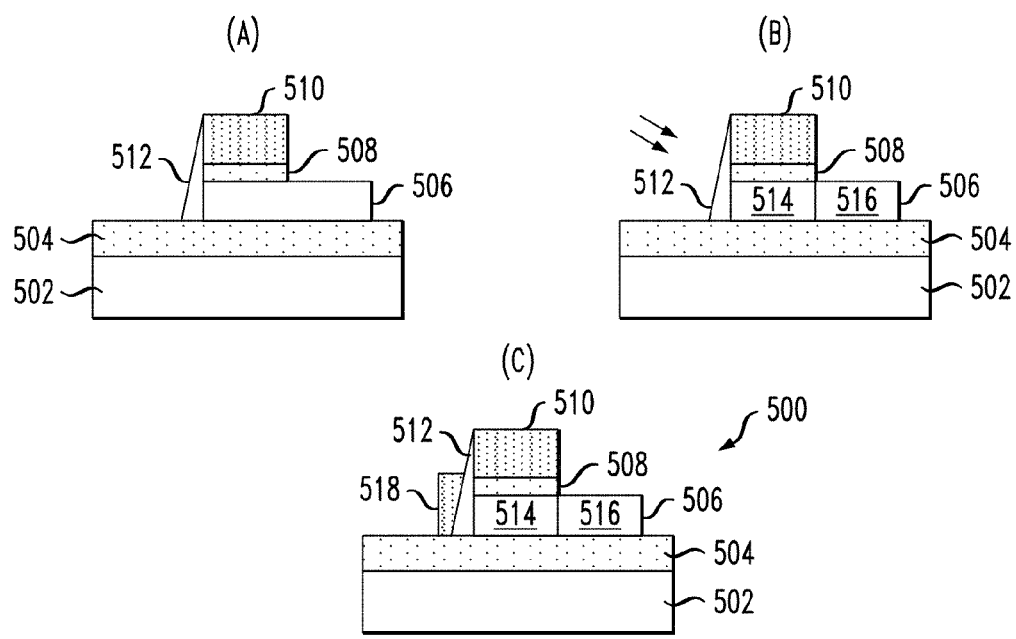
FIGS. 5A through 5C are cross-sectional views depicting integrated circuit processing steps in forming an exemplary MOS device including an energy filter, in accordance with an embodiment of the invention.

FIGS. 5A through 5C show cross-sectional views of an exemplary MOS transistor device 500 including an energy filter during various states of processing, in accordance with a first illustrative embodiment of the invention. FIG. 5A shows a structure comprising a semiconductor substrate 502. The substrate 502 is commonly formed of single-crystal silicon (e.g., having a <100> or <111> crystal orientation), although suitable alternative materials may also be used, such as, but not limited to, germanium (Ge), gallium arsenide (GaAs), etc. Additionally, the substrate is preferably modified by adding an impurity or dopant to change the conductivity of the material (e.g., n-type or p-type). For example, in one embodiment of the invention, the substrate 502 is of p-type conductivity and may thus be referred to as a p+ substrate. A p+ substrate may be formed by adding a p-type impurity or dopant (e.g., boron) of a desired concentration (e.g., about $5 \times 10^{18}$ to about $5 \times 10^{19}$ atoms per cubic centimeter) to the substrate material, such as by a diffusion or implant step, to change the conductivity of the material as desired. Substrate 502 may be a handle wafer of a silicon-on-insulator (SOI) substrate which can also have very low doping concentration.

The term "semiconductor layer" as may be used herein is intended to broadly encompass any semiconductor material upon which and/or in which other materials may be formed. The semiconductor layer may comprise a single layer, such as, for example, substrate 502, or it may comprise multiple layers, such as, for example, the substrate and an epitaxial layer (not shown). The semiconductor wafer comprises the substrate 502, with or without the epitaxial layer, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

The transistor 500 further includes a buried oxide layer 504 formed on at least a portion of an upper surface of the substrate 502. Buried oxide layer 504 may be formed, for example, using an oxidation step to form silicon dioxide (SiO₂), although alternative methodologies for forming the buried oxide layer are contemplated, such as, for example, deposition. A device layer 506 is preferably formed on an upper surface of at least a portion of the buried oxide layer 504. At least one active device is formed in the device layer 506. The device layer 506 may comprise undoped silicon, although alternative semiconducting materials are similarly contemplated.

A gate oxide layer 508 is formed on a portion of an upper surface of the device layer 506. A gate 510 is formed on an upper surface of the gate oxide layer 508 above at least a portion of the device layer 506. The gate 510 may be formed of, for example, metal (e.g., aluminum, copper, gold, etc.), although alternative suitable conductive or semiconductive materials (e.g., polysilicon) may be similarly employed. The gate oxide layer 508 serves to electrically isolate the gate 510 from the device layer 506. Preferably, respective edges of the gate 510 and the gate oxide layer 508 are substantially vertically aligned with an edge of the device layer 506 as shown, although alternative arrangements may be formed.

An insulator spacer 512 is formed on at least sidewalls of the gate 510, gate oxide layer 508 and device layer 506 using, for example, a growth step. This insulator spacer will ultimately be used to implement the energy filter, embodiments of which are described herein above. The insulator spacer 512 may be sloped, as shown, as an inherent property of the process used to form the insulator spacer. It is to be understood that the invention is not limited to the size and/or shape of the insulator spacer. The insulator spacer 512 may be formed of a dielectric material (e.g., SiO₂, SiN, SrTiO₃, etc.), although alternative materials, such as, for example, large bandgap semiconducting materials, may also be employed.

FIG. 5B illustrates the formation of a channel 514 and a drain 516 in the device layer 506. The drain 516 is preferably heavily doped, such as by a conventional implant step, with an impurity of a known concentration level to selectively change the conductivity of the material as desired. Preferably, the drain 516 has a conductivity type associated therewith which is opposite a conductivity type of the channel 514, so that an active region can be formed in the device. In one embodiment of the invention, the drain 516 is of n-type conductivity. The channel may comprise undoped silicon, or an alternative material. When a voltage is applied to the gate, an inversion layer will be formed in the channel 514. In this manner, the gate potential controls a current conduction in the device. An impurity band is formed in the insulator spacer 512, for example by doping during growth or by implantation after growth. For an amorphous insulator, implantation would lead to the formation of an impurity band therein.

FIG. 5C shows the formation of a source contact 518 on at least a portion of an upper surface of the insulator spacer 512. The source contact in conjunction with the insulator spacer 512 including the impurity band will preferably replace a traditional source region formed in a conventional manner. The source contact 518 may comprise, for example, metal or a semiconducting material. A primary function of the source contact 518 is to supply carriers for injection into the channel 514. The insulator spacer 512 and impurity band function primarily to control an energetic window through which the carriers pass. As explained herein above, by selecting an appropriate dopant species and concentration level, certain characteristics of the energetic window in the energy filter can be adjusted, including energetic width and/or position relative to the channel 514, thereby advantageously controlling an inverse subthreshold slope of the device.

Figure 6:
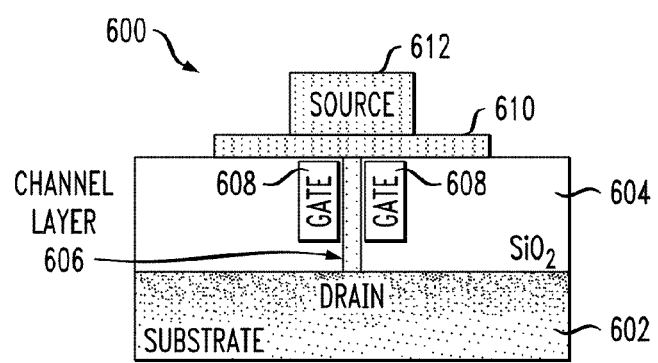
FIG. 6 is a cross-sectional view depicting an exemplary silicon fin transistor device including an energy filter, in accordance with another embodiment of the invention.

FIG. 6 is a cross-sectional view depicting an exemplary transistor device 600 including an energy filter, in accordance with another embodiment of the invention. Device 600 is implemented as a vertical fin FET, also referred to as a FinFET device. A FinFET is one example of a double-gate structure that includes a channel formed as a substantially vertical fin (hence the name). A semiconductor (e.g., silicon) fin, also referred to as a semiconductor nanowire or nanotube (if the fin has a quadratic or circular footprint), transistor is formed on a substrate 602 and embedded into a silicon dioxide layer 604, or alternative insulating layer, formed on at least a portion of an upper surface of the substrate. The nanotube may comprise, for example, a carbon nanotube. The substrate 602 serves as a drain of the transistor in this embodiment, although in alternative arrangements a separate drain may be formed. The device 600 further includes a channel 606 formed through the silicon dioxide layer 604. A first end of the channel 606 is electrically connected to the substrate 602 and a second end of the channel is substantially planar with an upper surface of the silicon dioxide layer 604. A gate 608 is formed in the silicon dioxide layer 604. The gate 608 preferably surrounds and is in close proximity to the channel 606. The gate 608 may be formed as at least a partial ring structure substantially surrounding the channel 606.

The structure including the silicon dioxide layer 604 and channel 606 is preferably planarized, such that the upper surface of the silicon dioxide layer is substantially even (planar) with the second end of the channel. Subsequently, an energy filter 610 is deposited on at least an upper surface of the channel 606, followed by deposition of a source contact 612 on at least a portion of an upper surface of the energy filter. The source contact 612 and the energy filter 610 are then patterned as illustrated in the figure. The energy filter 610 includes an impurity band therein, as may be formed in a manner consistent with the teachings set forth herein.

Figure 7:
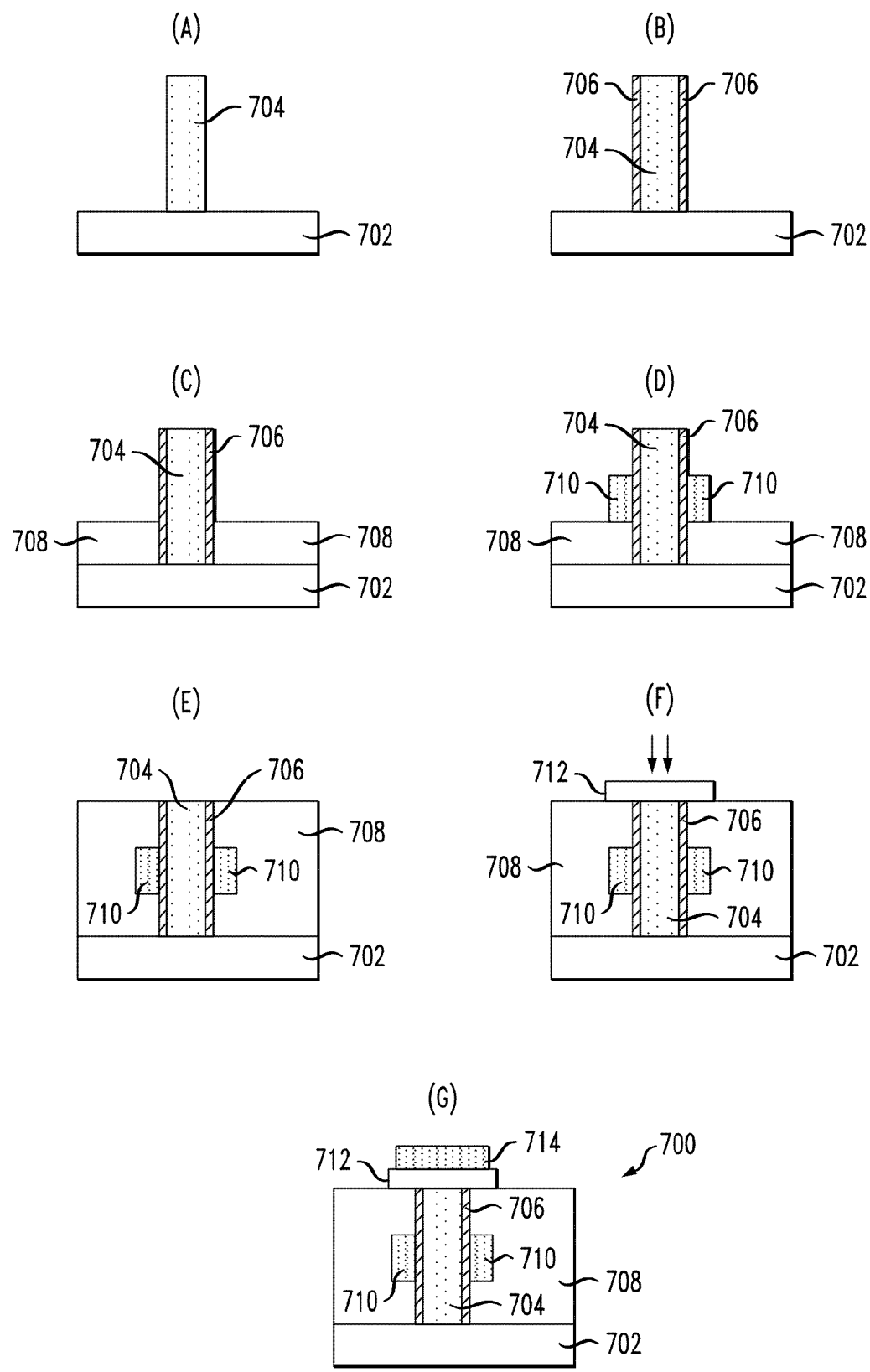
FIGS. 7A through 7G are cross-sectional views depicting integrated circuit processing steps in forming the silicon fin transistor shown in FIG. 6, in accordance with an embodiment of the invention.

FIGS. 7A through 7G are cross-sectional views depicting integrated circuit processing steps which may be used in forming the exemplary semiconductor fin transistor (FinFET) shown in FIG. 6, in accordance with an embodiment of the invention. FIG. 7A depicts the formation of a semiconductor nanowire 704 on at least a portion of an upper surface of a substrate 702. The substrate 702 may comprise silicon, although alternative semiconductor materials may be utilized (e.g., germanium (Ge), gallium arsenide (GaAs), indium phosphide (InP), etc.). Nanowire 704 may be fabricated, for example, by etching the substrate 702 or by epitaxial growth (e.g., vapor-liquid-solid growth using a metal catalyst, or alternative material, which is subsequently removed or by selective area epitaxy). Suitable materials for forming nanowire 704 include, but are not limited to, silicon, germaniun, gallium arsenide, indium arsenide (InAs), indium antimonide (InSb), indium phosphide, etc., either doped or undoped.

FIG. 7B illustrates the formation of a gate oxide layer 706 on at least sidewalls of the nanowire 704. Gate oxide layer 706 may be formed, for example, using thermal oxidation or atomic layer deposition, although alternative fabrication techniques may be similarly employed. Suitable materials for forming gate oxide layer 706 include, but are not limited to, silicon dioxide, aluminum oxide ($Al_2O_3$), hafnium oxide ($HfO_2$), etc.

FIGS. 7C through 7E depict steps for fabricating a gate of the FinFET device. Specifically, an insulating layer 708 is first formed on at least a portion of the upper surface of the substrate 702, as shown in FIG. 7C, using thermal oxidation or deposition (e.g., chemical vapor deposition (CVD)). Insulating layer 708 preferably comprises silicon dioxide, although other low dielectric constant (k) dielectric materials (e.g., k less than about 4) may be used, such as, for example, polymers containing elements of Si, C, O and H, including organosilicate glass (SiCOH), methylsiloxane, methylsilsesquioxanes, and other organic and inorganic polymers.

Next, a gate 710 is formed on at least a portion of an upper surface of the insulating layer 708, proximate the nanowire 704, as shown in FIG. 7D. Preferably, gate 710 substantially surrounds nanowire 704. Gate 710 may be formed using, for example, sputtering of a metal or polysilicon CVD, followed by etching (e.g., back etching) to adjust a shape (e.g., height) of the gate. However, the invention is not limited to forming gate 710 in this manner. Once gate 710 is formed, insulating layer 708 is extended, such as by thermal oxidation or deposition, so as to make the insulating layer substantially planar with the nanowire 704 as shown in FIG. 7E. A chemical mechanical polishing (CMP) step, or alternative process, may be used to planarize the upper surface of the insulating layer 708 and nanowire 704.

FIG. 7F illustrates the formation of an energy filter 712 on at least a portion of the upper surface of insulating layer 708 and the upper surface of nanowire 704. An impurity band is formed within the energy filter 712, such as, for example, by implanting a dopant of a desired type and concentration level, as previously described. Suitable materials and dopants for forming the energy filter 712 were provided above in connection with FIG. 3. A source contact 714, which comprises a conductive material (e.g., metal), is then formed on an upper surface of the energy filter 712, such as by deposition, as depicted in FIG. 7G. Preferably, the energy filter 712, which comprises an insulting material, extends laterally beyond nanowire 704 so that the source contact 714 does not electrically contact the nanowire 704. The nanowire 704 preferably serves as a channel for the FinFET device 700 and the substrate 702 serves as a drain for the device. Source contact 714 supplies the carriers which are injected into the nanowire channel. It is to be understood that the device depicted in FIGS. 7A through 7G is provided by way of illustration only, and that other device arrangements within the scope of the present invention may be fabricated by those skilled in the art given the teachings herein.

Embodiments of the present invention provide, inter alia, the following advantages over standard transistor devices:
  The use of an impurity band as an energy filter yields higher on-state currents when compared to BTBT FET devices, since no tunneling barrier is required.
  The energy filter can be manufactured using standard integrated circuit fabrication techniques such as, for example, atomic layer deposition (ALD) and molecular beam epitaxy (MBE), which facilitates an extremely well-controlled process and a well-defined geometry. This drastically reduces variability and increases yield.
  The energy filter can be tuned in terms of certain characteristics, including energetic width and position, in order to achieve a desired trade-off between high on-state current and low off-state leakage (and steep inverse subthreshold slope). This can be achieved, in accordance with aspects of the invention, by selecting appropriate dopant species and concentration levels thereof.
  There are essentially no requirements regarding electrostatic integrity of the actual FET device. In principle, even a device exhibiting short channel effects would still lead to steep inverse subthreshold slopes. This greatly relaxes fabrication constraints.
  Even materials with smaller band gap but higher carrier mobility can be used since current in the device is controlled primarily by the energy filter and not by the small band gap as in conventional FETs or BTBT FETs.

Techniques of the present invention are well-suited for implementation in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of forming a metal-oxide semiconductor (MOS) device, the method comprising the steps of:
    forming a device layer on an upper surface of at least a portion of a buried oxide layer;
    forming a gate oxide layer on at least a portion of an upper surface of the device layer;

forming a gate on at least a portion of an upper surface of the gate oxide layer, the gate being formed substantially proximate a channel defined in the device layer;

doping at least a portion of the device layer not covered by the gate and the gate oxide layer with at least one impurity of a prescribed concentration level so as to form a drain therein;

forming an insulator spacer on at least one sidewall of each of the gate, the gate oxide layer and the device layer;

doping at least a portion of the insulator spacer with at least one impurity of a prescribed concentration level so as to form an energy filter therein; and forming a metallic source contact directly on at least a portion of an upper surface of the doped insulator spacer to enable injection of carriers from the source contact through the doped insulator spacer into the channel.

2. A method of forming a metal-oxide semiconductor (MOS) device, the method comprising the steps of:

forming first and second source/drains, the first and second source/drains being spaced apart relative to one another;

forming a channel between the first and second source/drains;

forming a gate between the first and second source/drains and proximate the channel, the gate being electrically isolated from the first and second source/drains and the channel and being configured to control a conduction of the channel as a function of a voltage potential applied to the gate; and forming an energy filter between the first source/drain and the channel, the energy filter comprising an impurity band operative to control an injection of carriers from the first source/drain through the impurity band into the channel.

3. The method of claim 2, wherein the step of forming the energy filter comprises configuring the impurity band in the energy filter so as to substantially cut off at least one of a high-energy and a low-energy tail portion of a Fermi function.

4. The method of claim 2, wherein the impurity band is formed by doping the energy filter with an impurity of a prescribed concentration level.

5. The method of claim 2, wherein the step of forming the energy filter comprises controlling an energetic width of the impurity band in the energy filter so as to provide an inverse sub threshold slope in the device that is smaller than about 60 millivolts per decade.

6. The method of claim 2, wherein the step of forming the energy filter comprises controlling an energetic width of the impurity band in the energy filter so as to optimize a trade-off between increased on-state current in the device and increased efficiency of the energy filter.

* * * * *